US007652751B2

(12) United States Patent
Baselmans et al.

(10) Patent No.: US 7,652,751 B2
(45) Date of Patent: Jan. 26, 2010

(54) LITHOGRAPHIC APPARATUS AND DEVICE MANUFACTURING METHOD

(75) Inventors: Johannes Jacobus Matheus Baselmans, Oirschot (NL); Sjoerd Nicolaas Lambertus Donders, 's-Hertogenbosch (NL); Christiaan Alexander Hoogendam, Veldhoven (NL); Hans Jansen, Eindhoven (NL); Jeroen Johannes Sophia Maria Mertens, Duizel (NL); Johannes Catharinus Hubertus Mulkens, Waalre (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/081,291

(22) Filed: Apr. 14, 2008

(65) Prior Publication Data
US 2008/0192219 A1 Aug. 14, 2008

Related U.S. Application Data

(63) Continuation of application No. 10/835,856, filed on May 3, 2004, now Pat. No. 7,379,159.

(51) Int. Cl.
*G03B 27/32* (2006.01)
*G03B 27/42* (2006.01)
*G03B 27/52* (2006.01)

(52) U.S. Cl. .............................. 355/77; 355/53; 355/55; 430/30; 250/548

(58) Field of Classification Search .................. 355/30, 355/53, 55, 77; 250/548; 430/30
See application file for complete search history.

(56) References Cited

U.S. PATENT DOCUMENTS

| 3,573,975 A | 4/1971 | Dhaka et al. |
| 3,648,587 A | 3/1972 | Stevens |
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,121,256 A | 6/1992 | Corle et al. |
| 5,610,683 A | 3/1997 | Takahashi |
| 5,715,039 A | 2/1998 | Fukuda et al. |
| 5,783,833 A | 7/1998 | Sugaya et al. |
| 5,825,043 A | 10/1998 | Suwa |
| 5,900,354 A | 5/1999 | Batchelder |
| 6,191,429 B1 | 2/2001 | Suwa |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Alan A Mathews
(74) *Attorney, Agent, or Firm*—Pillsbury Winthrop Shaw Pittman LLP

(57) ABSTRACT

A lithographic apparatus and method, in an embodiment for immersion lithography, are disclosed with a single stage in which leveling and exposure are performed simultaneously.

20 Claims, 3 Drawing Sheets

U.S. PATENT DOCUMENTS

| | | |
|---|---|---|
| 6,236,634 B1 | 5/2001 | Lee et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,878,916 B2 | 4/2005 | Schuster |
| 6,952,253 B2 | 10/2005 | Lof et al. |
| 7,009,862 B2 | 3/2006 | Bleeker |
| 7,034,917 B2 | 4/2006 | Baselmans et al. |
| 7,050,146 B2 | 5/2006 | Duineveld et al. |
| 7,075,616 B2 | 7/2006 | Derksen et al. |
| 7,081,943 B2 | 7/2006 | Lof et al. |
| 7,193,232 B2 | 3/2007 | Lof et al. |
| 7,199,858 B2 | 4/2007 | De Smit et al. |
| 7,326,522 B2 | 2/2008 | Dierichs |
| 7,359,030 B2 | 4/2008 | Simon et al. |
| 7,379,159 B2 * | 5/2008 | Baselmans et al. ............ 355/55 |
| 2002/0020821 A1 | 2/2002 | Van Santen et al. |
| 2002/0163629 A1 | 11/2002 | Switkes et al. |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. |
| 2004/0119954 A1 | 6/2004 | Kawashima et al. |
| 2004/0125351 A1 | 7/2004 | Krautschik et al. |
| 2005/0110973 A1 | 5/2005 | Streefkerk et al. |
| 2005/0132914 A1 | 6/2005 | Mulkens et al. |
| 2005/0134815 A1 | 6/2005 | Van Santen et al. |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-161614 A | 6/1995 |
| JP | 07-220990 | 8/1995 |
| JP | 08-064506 A | 3/1996 |
| JP | 10-154659 A | 6/1998 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithoqraphy 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9(1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Translation of Notice of Reasons for Rejection for Japanese Patent Application No. 2005-130901 dated Jun. 3, 2008.

* cited by examiner

LITHOGRAPHIC APPARATUS AND DEVICE MANUFACTURING METHOD

This application is a continuation application of co-pending U.S. patent application Ser. No. 10/835,856, filed May 3, 2004, now allowed, which application is herein incorporated in its entirety by reference.

FIELD

The invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In European patent application no. 03257072.3, hereby incorporated in its entirety by reference, the idea of a twin or dual stage immersion lithography apparatus is disclosed. Such an apparatus is provided with two substrate tables for supporting the substrate. Leveling measurements are carried out with a substrate table at a first position, without immersion liquid, and exposure is carried out with a substrate table at a second position, where immersion liquid is present. Alternatively, the apparatus can have only one substrate table moving between the first and second positions.

A problem with a dual stage immersion apparatus is that it has a large footprint which is disadvantageous because of the pressures on space in manufacturing facilities, especially clean rooms. A problem with a single stage apparatus is that throughput is reduced by the need to perform leveling measurements at the exposure position prior to exposure. U.S. Pat. No. 5,825,043, hereby incorporated in its entirety by reference, discloses a focusing apparatus that has a first detection system having a detection area at a first position located outside the field of the objective optical system, a second detection system having a detection area at a second position located outside the field of the objective optical system and spaced apart from the first position, and a third detection system having a detection area at a third position located outside the field of the objective optical system and spaced apart from each of the first and second positions. A calculator calculates a deviation between a first focus position and a target focus position and temporarily stores a second focus position at the time of detection made by the first detection system. A controller controls focusing on the surface of the workpiece on the basis of the calculated deviation, the stored second focus position and a third focus position when the area on the workpiece corresponding to the detection area of the first detection system is positioned in the field of the objective optical system by relative movement of the workpiece and the objective optical system. This method however may introduce errors and may not be as fast as a dual stage solution.

Accordingly, it would be advantageous, for example, to provide a fast and accurate way of making leveling measurements.

According to an aspect, there is provided a lithographic projection apparatus comprising:

an illuminator configured to provide a beam of radiation;

a support structure configured to hold a patterning device, the patterning device configured to impart the beam with a pattern in its cross-section;

a substrate table configured to hold a substrate;

a projection system configured to project the patterned beam along an optical axis onto a target portion of the substrate;

a sensor configured to measure the height of a portion of the substrate at the same time as projecting of the patterned beam onto a different portion of the same substrate;

a memory configured to store information about the height of the portion measured by the sensor; and a controller configured to control, based on information about the height of the portion of the substrate relative to a reference position on the substrate or the substrate table derived or obtained from the stored information in the memory, positioning of the substrate such that after measuring by the sensor, the portion is moved to under the optical axis substantially a pre-determined distance from the projection system.

According to an embodiment, it may be possible to avoid the need for a dual stage apparatus and the surface of the substrate can be mapped during exposure of the substrate. As each portion of the substrate to be exposed is mapped by the sensor, accuracy may be high. There may be a small throughput penalty in that the path which the substrate needs to take under the projection system should ensure that each portion of the substrate to be imaged first passes under the sensor. One way to increase throughput is to provide more than one sensor, for example on opposite sides of the projection system or spaced around the projection system, perhaps optimized for a given substrate path under the projection system. The sensor may measure the substrate either through immersion liquid which is provided between the projection system and the substrate or through the atmosphere (be it vacuum or gas).

In an embodiment, the sensor is configured to measure a tilt of the portion around an axis orthogonal to the optical axis, and the controller is configured to control positioning of the substrate, based on the contents of the memory, such that the portion is substantially orthogonal to the optical axis. In this way, imaging accuracy may be further improved because the varying topography of the substrate is taken into account (i.e. not only the variations in height but also the variations in tilt are accounted for).

The sensor may comprise a sensor array so as to measure the height of a plurality of points on the substrate substantially simultaneously. This enables tilt information to be derived and also averaging across the exposure field.

In case not all of the substrate area can be measured conveniently, the height of points that cannot be directly measured may be interpolated or extrapolated from measurements that can be made. To improve accuracy of such interpolation a global level measurement can be obtained by measuring the height of points forming a ring substantially all around the periphery of the substrate.

The portion measured by the sensor is not on the optical axis of the projection system. This allows the sensor to be positioned away from the projection system and means that construction of the apparatus may be greatly simplified because there is little room for extra sensors in an immersion apparatus close to the projection system.

According to a further aspect, there is provided a lithographic apparatus comprising:

an illuminator configured to provide a beam of radiation;

a support structure configured to hold a patterning device, the patterning device configured to impart the beam with a pattern in its cross-section;

a substrate table configured to hold a substrate;

a projection system configured to project the patterned beam onto a target portion of the substrate;

a sensor configured to measure a distance from the sensor to a measurement portion of the substrate, which measurement portion is different to the target portion;

a controller configured to control the apparatus to perform simultaneous projection of the patterned beam and measurement using the sensor and to control positioning of the substrate such that each portion of the substrate which is to be a target portion is a measurement portion before being a target portion.

An advantage of simultaneous projection of the patterned beam and leveling measurement is that there may be only a small decrease in throughput because of the necessity for the substrate to follow a path which assures that each part of the substrate passes by the sensor before being illuminated by the projection beam.

In an embodiment, the apparatus comprises a calculator configured to calculate the position of the measurement portion in the direction of the optical axis relative to a reference on the substrate or substrate table based on the output of the sensor and the position of the substrate table. This calculator may take account of the varying height and/or tilt of the substrate table which will occur in order for the substrate to be positioned in focus below the projection system. The apparatus may be provided with a memory configured to store information about the measurement portion measured by the sensor. The controller may be configured to position the substrate table based on the contents of the memory such that each target portion is substantially the same distance from the projection system during projection. This may ensure that each portion of the substrate which is imaged will be imaged in focus.

In an embodiment, the sensor is configured to measure tilt of the substrate around an axis orthogonal to the optical axis of the projection system. This may improve imaging accuracy yet further. In an embodiment, the measurement portion is wider than the target portion. This may enable certain areas of the target portion to be measured twice resulting in higher accuracy.

In an embodiment, the apparatus comprises a liquid supply system configured to provide an immersion liquid to a space between the projection system and the substrate. Optionally, the liquid supply system may provide liquid between the sensor and the substrate so that leveling is carried out under the same circumstances as imaging. However, this need not necessarily be the case and no liquid need be provided between the sensor and the substrate.

According to a further aspect, there is provided a device manufacturing method comprising:

measuring a height of a portion of the substrate and storing a result in a memory;

after measuring the portion, based on a height of the portion above a reference on the substrate or a substrate table derived or obtained from the result in the memory, moving the portion to under an optical axis of a projection system such that the portion is substantially a pre-determined distance from the projection system; and projecting a patterned beam of radiation, using the projection system, onto the portion of the substrate at the same time as measuring the height of a different portion of the same substrate.

According to a further aspect, there is provided a device manufacturing method comprising:

projecting a patterned beam of radiation onto a target portion of a substrate;

measuring a height of a measurement portion, different from the target portion, of the substrate at the same time as projecting; and positioning the substrate such that each target portion is a measurement portion before being a target portion.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
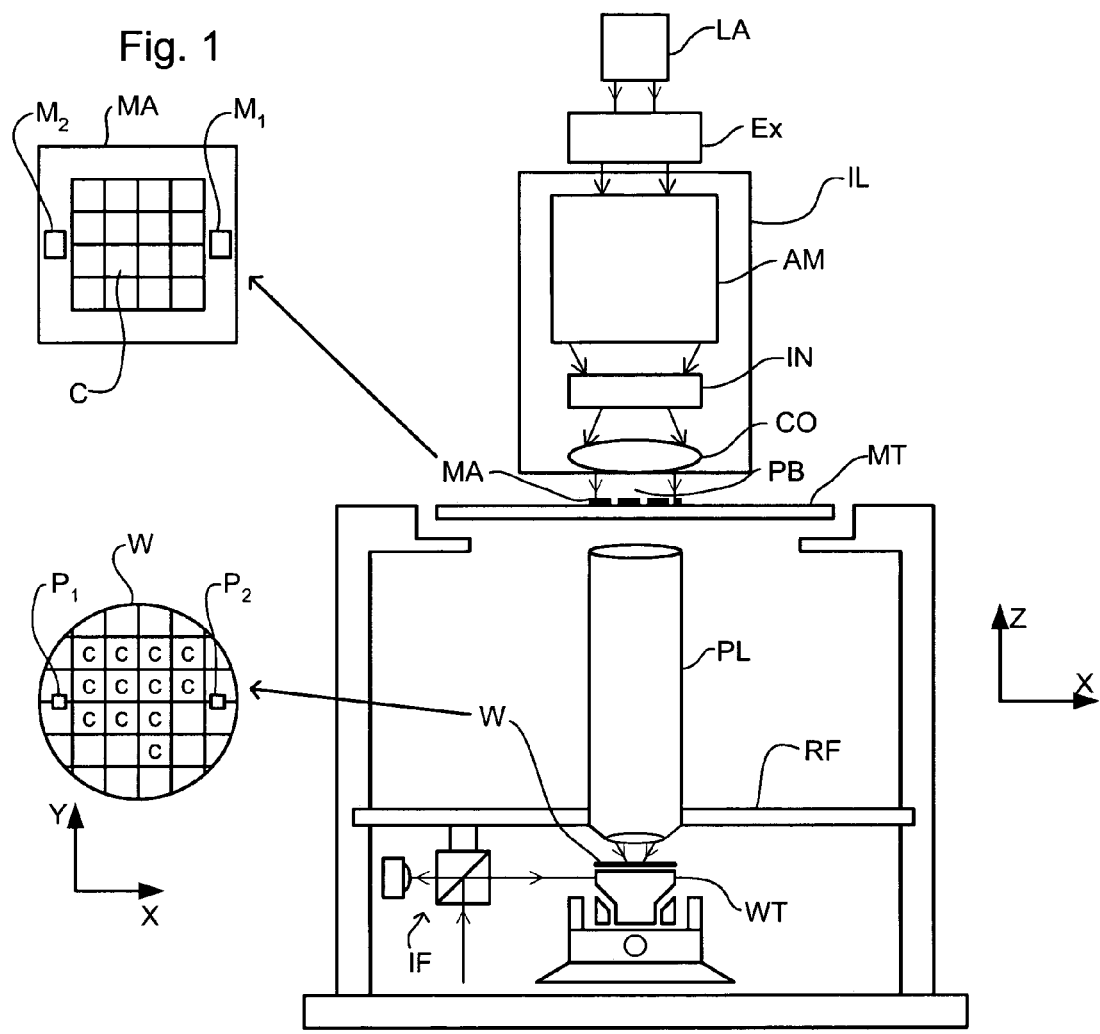
FIG. 1 depicts a lithographic apparatus according to an embodiment of the invention.
Figure 2:
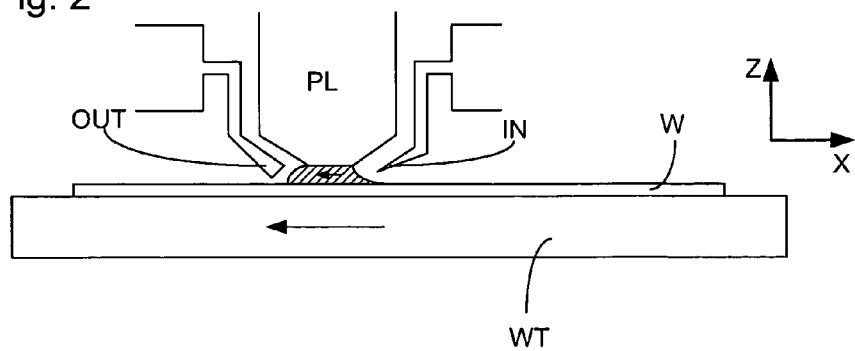
FIG. 2 depicts, in cross-section, a liquid supply system suitable for use in an embodiment of the invention.
Figure 3:
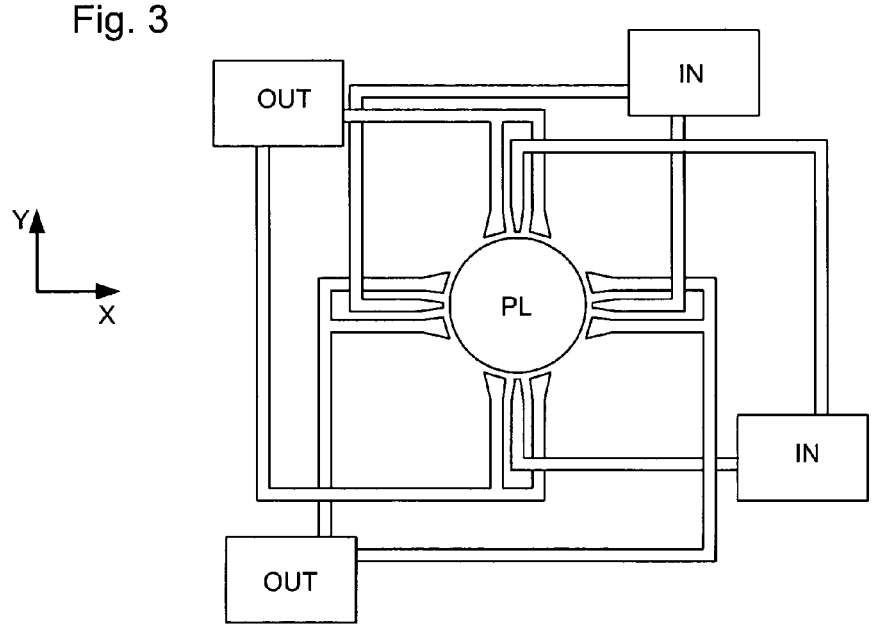
FIG. 3 illustrates, in plan, the liquid supply system of FIG. 2.

FIG. 1 schematically depicts a lithographic apparatus according to a particular embodiment of the invention. The apparatus comprises:

an illumination system (illuminator) IL for providing a projection beam PB of radiation (e.g. UV radiation).

a first support structure (e.g. a mask table) MT for supporting a patterning device (e.g. a mask) MA and connected to a first positioning device for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source. The source and the lithographic apparatus may be separate entities, for example when the source is an excimer laser. In such cases, the source is not considered to form part of the lithographic apparatus and the radiation beam is passed from the source to the illuminator IL with the aid of a beam delivery system comprising for example suitable directing mirrors and/or a beam expander. In other cases the source may be integral part of the apparatus, for example when the source is a mercury lamp. The source and the illuminator IL, together with the beam delivery system if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

One or more embodiments of the invention is intended for use in an immersion type of lithographic projection apparatus, though may be used in other kinds of lithographic projection apparatus.

Figure 5:
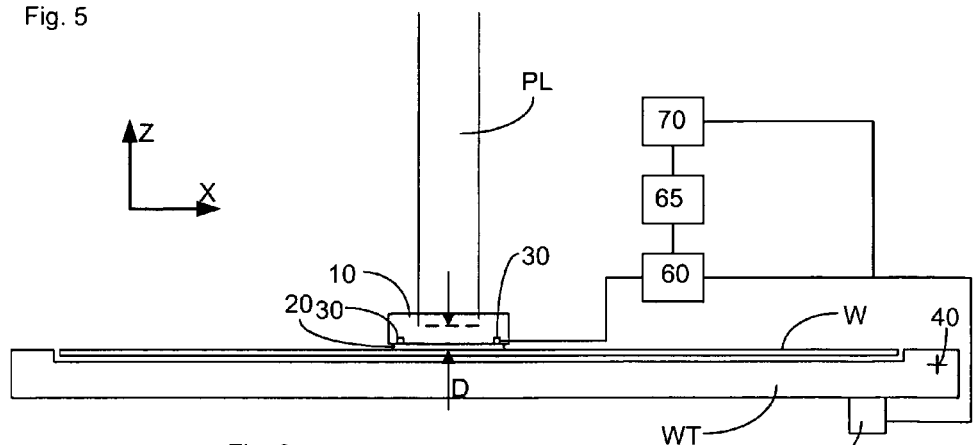
FIG. 5 illustrates, in cross-section, details of a lithographic projection apparatus in accordance with an embodiment of the invention.

FIG. 5 illustrates an immersion lithographic projection apparatus comprising a barrier member 10 (which is, for example, annular). The barrier member 10 surrounds a final element of the projection system PL to form a space between the projection system PL, the substrate W and the inside of the barrier member 10. Immersion liquid 20 is provided to the space. A seal device, for example a gas seal, around the outer lower periphery of the barrier member 10 can seal the barrier member 10 against the substrate W such that liquid is contained in the space. Such a liquid supply system is described in European Patent Application No. 03257070.7, hereby incorporated in its entirety by reference. One or more embodiments of the invention can be used with such a liquid supply system as well as with other types of local area liquid supply systems which supply liquid to a localized area of the substrate W as well as other types of liquid supply system, for example, bath type solutions in which the whole of the substrate W is immersed in a bath of immersion liquid.

In order for correct imaging of the substrate W to occur, it is important that the distance D between the projection system PL and the top surface of the substrate W is adjusted such that the projection beam PB is focused on the top surface of the substrate W. The distance D is a predetermined length which typically does not vary. In an embodiment, the substrate table WT which holds the substrate W is adjusted in the Z direction, which is a direction of the optical axis of the projection system, such that the distance D is maintained substantially at a predetermined distance irrespective of which part of the substrate W is being imaged. To this end, a sensor 30 is provided for measuring a distance from the sensor 30 to the top surface of the substrate W. The sensor 30 is positioned outside of the optical axis of the projection system PL and measures the distance to a measurement portion of the substrate W which is adjacent the sensor 30, e.g., the vertical distance between the sensor 30 and the substrate W is measured. From a knowledge of the position of the substrate table WT relative to the projection system PL and the position of the sensor 30 relative to the projection system PL, it is possible for a calculator 60 to calculate the position of the measurement portion in a direction of the optical axis of the projection system PL relative to a reference 40 on the substrate W or on the substrate table WT. This information is stored in a memory 65. The information can be stored in any way so long as it is possible to extract information which enables the measurement portion to be positioned under the projection system PL at the predetermined distance D. In addition or alternatively, the sensor 30 may directly measure the position of the measurement portion in a direction of the optical axis of the projection system PL relative to the reference 40 on the substrate W or on the substrate table WT, for example, by simultaneously projecting a beam onto the measurement portion and onto the reference 40. This information may also or alternatively stored in the memory 65.

With knowledge from the memory 65 of the position of the measurement portion relative to the reference point 40, a controller 70 can drive actuator(s) 50 of the substrate table WT to move the measurement portion under the optical axis of the projection system PL such that the measurement portion becomes a target portion ready for illumination by the projection system PL. With a knowledge of the position of the target portion (the previous measurement portion), the controller 70 can also adjust the height of the substrate table WT in the direction of the optical axis (Z direction) such that the target portion (previously the measurement portion) can be adjusted to be the predetermined distance D from the projection system PL.

Therefore, the controller 70 controls the substrate table WT such that each portion of the substrate W which is to be imaged first passes underneath the sensor 30 before being imaged so that positional information of each portion to be imaged is stored in the memory 65 before being imaged. This will be described later with reference to FIG. 7.

In FIG. 5 it is illustrated that the sensor 30 is mounted on the barrier member 10 which is part of the liquid supply system. This need not be the case and the sensor 30 could be mounted to the projection system PL itself. Indeed, if the sensor 30 is mounted to the barrier member 10, a further calculation by the calculator 60 is used to take account of movement relative to the projection system PL in the Z (and X and Y) direction of the barrier member 10 which may be free to move in those directions. If the sensor 30 is mounted stiffly to the projection system PL, such a further computation is typically not needed.

As illustrated in FIG. 5, the sensor 30 measures the distance to the substrate W through the liquid 20. This need not be the case and these measurements can take place through the atmosphere which may be a vacuum or may be a gas.

In FIG. 5, two sensors 30 are illustrated. These are positioned on opposite sides of the projection system PL. This gives greater freedom in the choice of the path of the substrate W under the projection system PL as the substrate may then move in the X axis in two directions while still enabling a sensor 30 to pass over each portion of the substrate W before that portion is illuminated.

The angle to the Z axis of the surface of the substrate W can also be important in ensuring good imaging. It is desirable that the surface of the substrate W which is imaged is orthogonal to the Z axis. This can be achieved in the same way that the correct height is achieved namely by enabling the sensor 30 to measure the tilt, using the calculator 60 to compute the tilt of the surface measured by sensor 30 relative to a reference axis on the substrate or substrate table and then using the controller 70 to tilt the substrate table WT around the Rz and Ry axes when the measurement portion becomes the target portion such that the target portion has a top surface which is orthogonal to the Z axis.

The sensor 30 may be comprised of a leveling beam source which can traverse a leveling beam over a first grating prior to reflection by the substrate W. A second grating is then placed in the path of the returning leveling beam which is reflected by the substrate W. The extent to which the images of the first and second gratings coincide is measured by a level measurement sensor and is determined by the height and/or tilt of the substrate W (the Z, Rx and Ry coordinates are thus determined). For a further description of level measurement of the substrate, reference is made to U.S. Patent Application Publication No. US 2003/0123035, hereby incorporated in its entirety by reference.

Thus, the apparatus of FIG. 5 can be used to perform off-axis "on the fly" (i.e. simultaneous projecting of the patterned beam and leveling measurements) leveling either through immersion liquid 20 or not.

Figure 6:
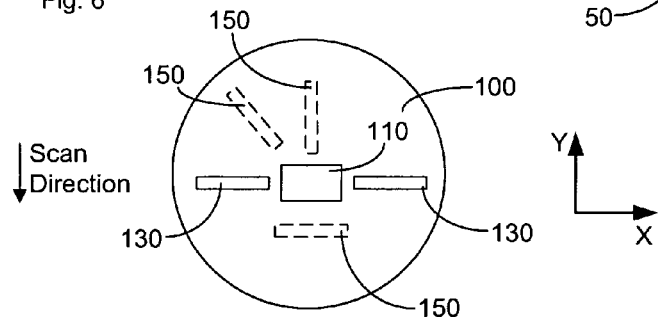
FIG. 6 illustrates the configuration of a target portion and a measurement portion according to an embodiment of the invention.
Figure 7:
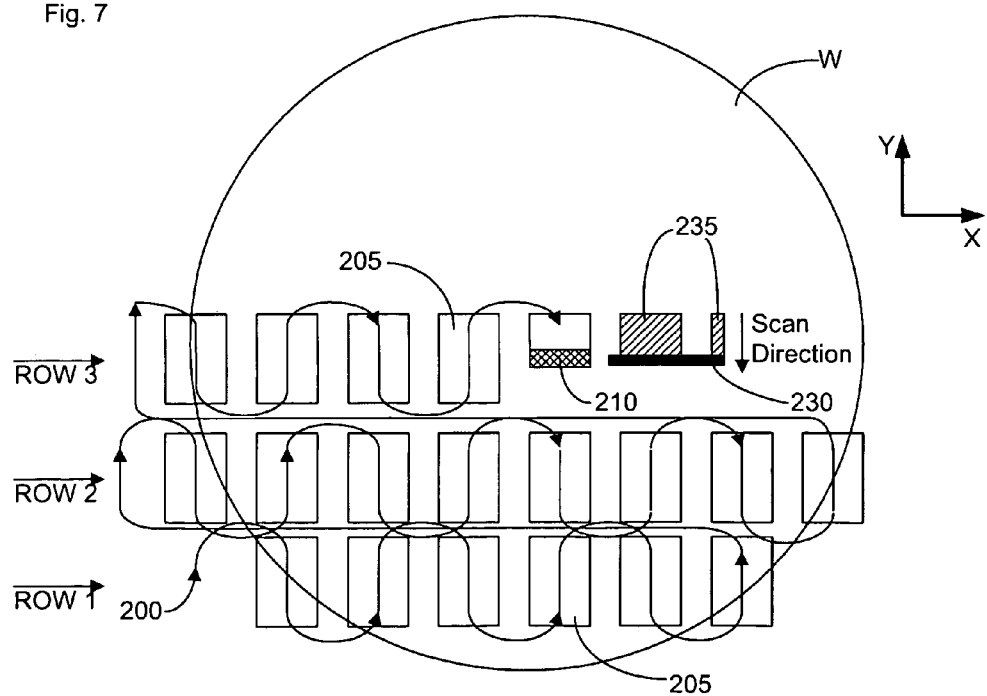
FIG. 7 illustrates an exposure sequence according to an embodiment of the invention.

FIGS. 6 and 7 illustrate in more detail how the apparatus according to an embodiment of the invention works in practice.

FIG. 6 illustrates the slits through which the projection beam and sensor beams project. The area 100 is the area in which liquid 20 is present. The central slit 110 is the exposure slit and illustrates the area on or through which the beam PB impinges. Slits 130 on the left and right, as illustrated, of the exposure slit are the slits for the level sensors. As can be seen these slits 130 are wider in the direction of scan than the exposure slit but not as deep. Ensuring that the leveling slits 130 are wider than the exposure slit 110 has advantages as will be described with reference to FIG. 7 in ensuring good leveling overlay.

As will be understood from the foregoing, only a single sensor 30 or a plurality of sensors may be used. In FIG. 6 the positioning of other sensors is illustrated by reference to other orientations of slits 150 illustrated by dashed lines which may be additional to or instead of the slits drawn in solid lines.

FIG. 7 shows the meandering path 200 which the substrate W can undergo under the projection system PL. The controller 70 drives the substrate table WT via actuators 50 such that the substrate W makes this path under the projection system PL. At the same time as moving the substrate table WT in the X and Y directions to follow this path, the controller is also adjusting the height of the substrate table WT in the Z direction to ensure that the predetermined distance D remains substantially constant and also in the Rx and Ry directions to ensure that the surface of the substrate W which is being imaged is substantially orthogonal to the Z axis. As can be seen from FIG. 7, which is a typical meander path for use when only a single sensor 30 is present and which is positioned on the right of the projection system PL as illustrated, the rows of the target portions 205 can only be traversed from the left to the right and between rows the substrate W should be moved to the right of the projection system PL so that the sensor 30 can be passed over the portions to be imaged before those portions are passed under the projection system PL. Area 210 illustrates the scanning of the projection beam PB through the slit 110 and area 230 is the equivalent scanning slit of the sensor beam. As can be seen by the areas 235 of diagonally hashed lines, the sensor slit 230 is wide enough to cover more than a single target portion 205 in a single scan. It can be seen from the diagonally hashed portions 235 that the leveled portions 235 can be stitched together to ensure improved accuracy as parts of each target portion 205 are leveled twice.

It will be appreciated that different meandering paths are possible, in particular with a sensor 30 at a different position relative to the projection system PL. For example it will be seen that if the top vertical slit 150 in FIG. 6 is used, the first row traverse along the bottom of the substrate W will only be for leveling but thereafter each scan can comprise both leveling and exposure apart from the last row traverse which only comprises exposure. With sensor 30 on the right of the projection system PL and the vertical sensor slit 150, it will be seen that very little decrease in performance can be achieved using the method according to an embodiment of the invention because there will only be a little wasted scanning movement for measurement only at the outer edges of the substrate W for the first half of the substrate W which is scanned.

Another immersion lithography solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system is disclosed in, for example, U.S. patent application Ser. No. 10/705,783, hereby incorporated in its entirety by reference.

Figure 4:
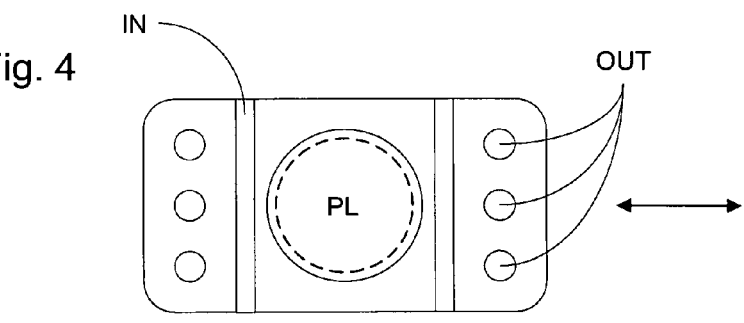
FIG. 4 illustrates, in plan and cross-section, a further type of liquid supply system.
Figure 4:
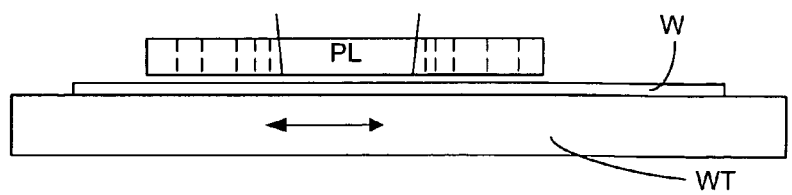

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

One or more embodiments of the invention can be applied to any immersion lithography apparatus, in particular, but not exclusively, those types mentioned above.

While specific embodiments of the invention have been described above, it will be appreciated that the invention may be practiced otherwise than as described. The description is not intended to limit the invention.

The invention claimed is:

1. A device manufacturing method comprising:
    measuring a height of a first exposure area of a first target portion on the substrate and storing a result of the measuring in a memory;
    after measuring the first exposure area of the first target portion, based on a height of the first target portion above a reference on the substrate or a substrate table derived or obtained from the result in the memory, moving the first exposure area to under an optical axis of a projection system such that the first exposure area is substantially a certain distance from the projection system; and
    projecting a patterned beam of radiation, using the projection system, onto the first target portion on the substrate at the same time as measuring the height of a second exposure area of a second target portion located on a different area of the same substrate than the first target portion.

2. The method of claim 1, further comprising, during the measuring, measuring a tilt of the first exposure area around an axis orthogonal to the optical axis and during the positioning, moving the first exposure area, based on the measured tilt, such that the first exposure area is substantially orthogonal to the optical axis.

3. The method of claim 1, further comprising controlling positioning of the substrate such that each exposure area of the substrate which is to be projected with a patterned beam of radiation is first measured before being projected with a patterned beam of radiation.

4. The method of claim 1, wherein the measuring comprises measuring the height of a plurality of points on the substrate.

5. The method of claim 1, further comprising calculating the position of the first exposure area in the direction of the optical axis relative to the reference on the substrate or substrate table based on the measured height of the first exposure area and the position of the substrate table.

6. The method of claim 1, further comprising providing a liquid to a space between the projection system and the substrate.

7. The method of claim 6, comprising providing liquid to a space between a sensor used to measure the height.

8. A device manufacturing method comprising:
    projecting a patterned beam of radiation onto a first exposure area of a first target portion on a substrate;
    measuring a height of a measurement portion of a second exposure area of a second target portion located on a different area of the same substrate than the first target portion at the same time as projecting the patterned beam of radiation onto a first exposure area; and
    positioning the substrate such that each second exposure area on the substrate which is to be a first exposure area is a measurement portion before being a first exposure area.

9. The method of claim 8, further comprising, during the measuring, measuring a tilt of the measurement portion around an axis orthogonal to an optical axis of a projection system used to project the patterned beam and during the positioning, moving the measurement portion, based on the measured tilt, such that the measurement portion is substantially orthogonal to the optical axis.

10. The method of claim 8, further comprising calculating the position of the measurement portion in the direction of an optical axis of a projection system used to project the patterned beam relative to a reference on the substrate or a substrate table based on the measured height of the measurement portion and the position of the substrate table.

11. The method of claim 8, further comprising providing a liquid to a space between a projection system used to project the patterned beam and the substrate.

12. The method of claim 11, comprising providing liquid to a space between a sensor used to measure the height of the measurement portion and the substrate.

13. The method of claim 8, further comprising storing measured information about the measurement portion to a memory and controlling the position of the substrate, based on the contents of the memory, such that each target portion is substantially the same distance from a projection system used to project the patterned beam during projection.

14. A device manufacturing method comprising:
    projecting a patterned beam of radiation onto a first exposure area of a first target portion on a substrate;
    measuring, during exposure of the first target portion, the height of a second exposure area of a second target portion located on a different area of the same substrate than the first target portion; and
    controlling, based on information about the measured height of the second target portion on the substrate, positioning of the substrate when the measured second exposure area on the substrate becomes a first exposure area.

15. The method of claim 14, further comprising calculating a position of the second exposure area in the direction of an optical axis of a projection system used for the projecting relative to a reference on the substrate or a substrate table holding the substrate based on the measuring and the position of the substrate table.

16. The method of claim 14, further comprising controlling the positioning of the substrate, based on the measurements of the second exposure area, such that each first exposure area is substantially the same distance, during projecting, from a projection system used for the projecting.

17. The method of claim 14, wherein the measuring comprises measuring a tilt of the substrate around an axis orthogonal to an optical axis of a projection system used for the projecting.

18. The method of claim 14, further comprising providing a liquid to a space between the substrate and a projection system used for the projecting.

19. The method of claim 14, wherein a measurement portion of the measuring is wider than the second target portion.

20. The method of claim 14, comprising controlling positioning of the substrate such that each second exposure area of the substrate which has the patterned beam projected onto it is positioned for the measuring prior to being positioned under the projection system.

* * * * *